United States Patent
Wallow et al.

(10) Patent No.: US 6,251,560 B1
(45) Date of Patent: Jun. 26, 2001

(54) PHOTORESIST COMPOSITIONS WITH CYCLIC OLEFIN POLYMERS HAVING LACTONE MOIETY

(75) Inventors: Thomas I. Wallow, Union City; Robert D. Allen, San Jose; Phillip Joe Brock, Sunnyvale; Richard Anthony DiPietro, San Jose; Hiroshi Ito, San Jose; Hoa Dao Truong, San Jose, all of CA (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/566,395

(22) Filed: May 5, 2000

(51) Int. Cl.⁷ .................................................... B03F 7/004
(52) U.S. Cl. ..................... 430/270.1; 430/325; 430/326
(58) Field of Search ................................ 430/270.1, 325, 430/326

(56) References Cited

U.S. PATENT DOCUMENTS

| | | | |
|---|---|---|---|
| 4,400,461 | 8/1983 | Chandross et al. | 430/311 |
| 4,855,017 | 8/1989 | Douglas | 156/643 |
| 5,310,619 | 5/1994 | Crivello et al. | 430/270 |
| 5,362,663 | 11/1994 | Bronner et al. | 437/52 |
| 5,399,647 | 3/1995 | Nozaki | 526/297 |
| 5,429,710 | 7/1995 | Akiba et al. | 216/17 |
| 5,468,819 | 11/1995 | Goodall et al. | 526/171 |
| 5,562,801 | 10/1996 | Nulty | 156/643.1 |
| 5,580,694 | 12/1996 | Allen et al. | 430/270.1 |
| 5,585,219 | 12/1996 | Kaimoto et al. | 430/270.1 |
| 5,618,751 | 4/1997 | Golden et al. | 438/392 |
| 5,705,503 | 1/1998 | Goodall et al. | 526/281 |
| 5,738,975 | 4/1998 | Nakano et al. | 430/280.1 |
| 5,744,376 | 4/1998 | Chan et al. | 437/190 |
| 5,750,680 | 5/1998 | Kim et al. | 540/200 |
| 5,770,346 | 6/1998 | Iwasa et al. | 430/270.1 |
| 5,776,657 | 7/1998 | Schaedeli et al. | 430/281.1 |
| 5,786,131 | 7/1998 | Allen et al. | 430/325 |
| 5,801,094 | 9/1998 | Yew et al. | 438/624 |
| 5,821,469 | 10/1998 | Shanmugham | 174/135 |
| 5,830,965 | 11/1998 | Imaizumi et al. | 526/309 |
| 5,837,419 | 11/1998 | Ushirogouchi et al. | 430/270.1 |
| 5,843,624 | 12/1998 | Houlihan et al. | 430/296 |
| 6,048,664 | 4/2000 | Houlihan et al. | 430/270.1 |
| 6,103,445 | * 8/2000 | Willson et al. | 430/270.1 |
| 6,103,449 | * 8/2000 | Sato | 430/270.1 |
| 6,124,074 | * 9/2000 | Varanasi et al. | 430/270.1 |
| 6,136,499 | * 10/2000 | Goodall et al. | 430/270.1 |
| 6,156,486 | * 12/2000 | Hattori et al. | 430/313 |

FOREIGN PATENT DOCUMENTS

| | | | |
|---|---|---|---|
| WO 97/33198 | 9/1997 | (EP) | G03F/7/039 |
| 0 880 074 A1 | 11/1998 | (EP) | G03F/7/004 |
| 10239845 | 9/1998 | (JP) | G03F/7/039 |
| 10301283 | 11/1998 | (JP) | G03F/7/039 |

OTHER PUBLICATIONS

Uetani, Y. et al, SPIE vol. 3678, pt. 1, Mar. 1999, 510–517.*

* cited by examiner

*Primary Examiner*—Rosemary E. Ashton
(74) *Attorney, Agent, or Firm*—Steven Capella

(57) ABSTRACT

Acid-catalyzed positive photoresist compositions which are imageable with 193 nm radiation (and possibly other radiation) and are developable to form photoresist structures of improved development characteristics and improved etch resistance are enabled by the use of resist compositions containing cyclic olefin polymer having a cyclic olefin monomer having a lactone moiety, the monomer having no oxygen atoms intervening between the lactone moiety and a ring of the cyclic olefin. Preferred lactone moieties are spirolactones (having a 5 or 6 membered ring) directly to a cyclic olefin ring.

31 Claims, No Drawings

PHOTORESIST COMPOSITIONS WITH CYCLIC OLEFIN POLYMERS HAVING LACTONE MOIETY

CROSS REFERENCE TO RELATED APPLICATIONS

Related applications are: U.S. patent application Ser. No. 09/266,342, filed Mar. 11, 1999, pending titled "Photoresist Compositions with Cyclic Olefin Polymers and Additive"; U.S. patent application Ser. No. 09/266,343, filed Mar. 11, 1999, pending titled "Photoresist Compositions with Cyclic Olefin Polymers and Hydrophobic Non-Steroidal Alicyclic Additives"; U.S. patent application Ser. No. 09/266,341, filed Mar. 11, 1999, now U.S. Pat. No. 6,124,074, titled "Photoresist Compositions with Cyclic Olefin Polymers and Hydrophobic Non-Steroidal Multi-Alicyclic Additives"; and U.S. patent application Ser. No. 09/266,344, filed Mar. 11, 1999, pending titled "Photoresist Compositions with Cyclic Olefin Polymers and Saturated Steroid Additives". The disclosures of the above applications are incorporated herein by reference.

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

The ability to produce smaller devices is limited by the ability of photolithographic techniques to reliably resolve smaller features and spacings. The nature of optics is such that the ability to obtain finer resolution is limited in part by the wavelength of light (or other radiation) used to create the lithographic pattern. Thus, there has been a continual trend toward use of shorter light wavelengths for photolithographic processes. Recently, the trend has been to move from so-called I-line radiation (350 nm) to 248 nm radiation.

For future reductions in size, the need to use 193 nm radiation appears likely. Unfortunately, photoresist compositions at the heart of current 248 nm photolithographic processes are typically unsuitable for use at shorter wavelengths.

While a photoresist composition must possess desirable optical characteristics to enable image resolution at a desired radiation wavelength, the photoresist composition must also possess suitable chemical and mechanical properties to enable transfer to the image from the patterned photoresist to an underlying substrate layer(s). Thus, a patternwise exposed positive photoresist must be capable of appropriate dissolution response (i.e. selective dissolution of exposed areas) to yield the desired photoresist structure. Given the extensive experience in the photolithographic arts with the use of aqueous alkaline developers, it is important to achieve appropriate dissolution behavior in such commonly used developer solutions.

The patterned photoresist structure (after development) must be sufficiently resistant to enable transfer of the pattern to the underlying layer(s). Typically, pattern transfer is performed by some form of wet chemical etching or ion etching. The ability of the patterned photoresist layer to withstand the pattern transfer etch process (i.e., the etch resistance of the photoresist layer) is an important characteristic of the photoresist composition.

While some photoresist compositions have been designed for use with 193 nm radiation, these compositions have generally failed to deliver the true resolution benefit of shorter wavelength imaging due to a lack of performance in one or more of the above mentioned areas. The resist compositions disclosed in the above-referenced applications represent advancement over the prior art in that the resists are capable of delivering the lithographic performance associated with 193 nm lithography, however there remains a desire for improved photoresist compositions useful in 193 nm lithography. For example, there is a desire for resist compositions exhibiting improved development characteristics (e.g., resolution, development speed, contrast, shrinkage, etc.), improved etch resistance, and improved lithographic process window.

SUMMARY OF THE INVENTION

The invention provides photoresist compositions which are capable of high resolution lithographic performance using 193 nm imaging radiation (and possibly also with other imaging radiation). The photoresist compositions of the invention possess an improved combination of imageability, developability and etch resistance needed to provide pattern transfer at very high resolutions which are limited only by the wavelength of imaging radiation. The photoresist compositions of the invention enable an improved lithographic process window.

The invention also provides lithographic methods using the photoresist compositions of the invention to create photoresist structures and methods using the photoresist structures to transfer patterns to an underlying layer(s). The lithographic methods of the invention are preferably characterized by the use of 193 nm ultraviolet radiation patternwise exposure. The methods of the invention are preferably capable of resolving features of less than about 150 nm in size, more preferably less than about 130 nm in size without the use of a phase shift mask.

In one aspect, the invention encompasses a photoresist composition comprising: (a) a cyclic olefin polymer, and (b) a photosensitive acid generator, the cyclic olefin polymer comprising:

i) cyclic olefin monomer units each having an acid-labile moiety that inhibits solubility in aqueous alkaline solutions, and ii) cyclic olefin monomer units each having a lactone moiety, the monomer having no oxygen atoms intervening between the lactone moiety and a ring of the cyclic olefin.

The photoresist compositions of the invention preferably also contain a bulky hydrophobic additive component which is substantially transparent to 193 nm ultraviolet radiation. The cyclic olefin polymers of the invention preferably contain at least about 5 mole % of units ii).

In another aspect, the invention encompasses a method of creating a patterned photoresist structure on a substrate, the method comprising:

(a) providing a substrate having a surface layer of the photoresist composition of the invention, (b) patternwise exposing the photoresist layer to radiation whereby portions of the photoresist layer are exposed to radiation, and (c) contacting the photoresist layer with an aqueous alkaline developer solution to remove the exposed portions of the photoresist layer to create the patterned photoresist structure.

Preferably, the radiation used in step (b) in the above method is 193 nm ultraviolet radiation.

The invention also encompasses processes for making conductive, semiconductive, magnetic or insulative structures using the patterned photoresist structures containing the compositions of the invention.

These and other aspects of the invention are discussed in further detail below.

DETAILED DESCRIPTION OF THE INVENTION

The photoresist compositions of the invention are generally characterized by the presence of cyclic olefin polymers which contain a cyclic olefin monomer having a lactone moiety, the monomer having no oxygen atoms intervening between the lactone moiety and a ring of the cyclic olefin. These compositions are capable of providing high resolution photolithographic patterns using 193 nm radiation with improved developability and pattern transfer characteristics. The invention further encompasses patterned photoresist structures containing the photoresist compositions of the invention, as well as processes for creating the photoresist structures and using the photoresist structures to form conductive, semiconductive and/or insulative structures.

The photoresist compositions of the invention generally comprise (a) a cyclic olefin polymer, and (b) a photosensitive acid generator, the cyclic olefin polymer comprising:
 i) cyclic olefin monomer units each having an acid-labile moiety that inhibits solubility in aqueous alkaline solutions, and
 ii) cyclic olefin monomer units each having a lactone moiety, the monomer having no oxygen atoms intervening between the lactone moiety and a ring of the cyclic olefin.

Cyclic olefin units i) may be any cyclic olefin monomeric unit having an acid labile moiety that inhibit solubility in aqueous alkaline solutions. Examples of cyclic olefin monomers include the following monomers illustrated by structure (I) below where $R_1$ represents an acid-labile protecting moiety and n is zero or some positive integer (preferably n is 0 or 1):

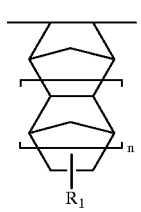

(I)

More preferably, the cyclic olefin units i) are selected from:

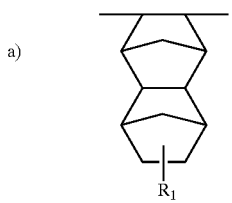 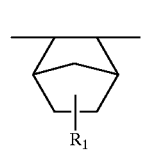

(II)

where $R_1$ represents an acid-labile protecting moiety. Preferred acid-labile protecting moieties are selected are selected from the group consisting of tertiary alkyl (or cycloalkyl) carboxyl esters (e.g., t-butyl, methyl cyclopentyl, methyl cyclohexyl, methyl adamantyl), ester ketals, and ester acetals. Tertiary butyl carboxyl ester is a most preferred acid-labile protecting moiety. If desired, combinations of cyclic olefin units i) having differing protecting functional groups may be used.

Cyclic olefin units ii) may be any cyclic olefin monomeric unit having a lactone moiety, the monomer having no oxygen atoms intervening between the lactone moiety and a ring of the cyclic olefin. Thus, all moieties (if any) intervening between the lactone and a ring of the cyclic olefin are oxygen-free. More preferably, the cyclic olefin units ii) contain lactone moiety which is (a) fused to a ring of the cyclic olefin—see structure III(b) below, (b) spiro-bonded to a ring of the cyclic olefin (such that at least one member of the spirolactone ring is also a member of a ring of the cyclic olefin)—see structure III(c) below, (c) bonded directly to a ring of the cyclic olefin without any atoms being shared between the lactone ring and a ring of the cyclic olefin—see structure III(a) below where m is zero, or (d) bonded to the cyclic olefin through a hydrocarbon moiety—see structure III(a) below where m is at least one. More preferably, the lactone moiety contains a 5 to 7 atom ring (including any atom(s) shared with the cyclic olefin ring), most preferably a 5 or 6 atom ring. More preferably, the lactone moiety is a spirolactone moiety (such that at least one member of the spirolactone ring is also a member of a ring of the cyclic olefin). Where the cyclic olefin monomeric unit containing the lactone moiety is capable of assuming different isomeric forms, it should be understood that the invention is not limited to any specific isomeric form and that mixtures of isomers can be used.

Examples of cyclic olefin units ii) may be represented by structures III(a)–(c) below:

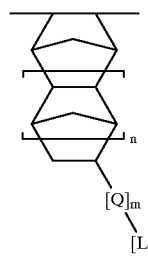 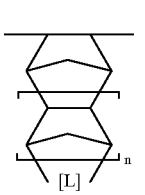

(III)

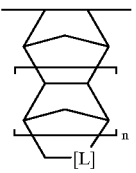

where [L] represents a lactone moiety, [Q] is a hydrocarbon (preferably a $C_1$–$C_{10}$ hydrocarbon, more preferably $C_1$–$C_3$), m is zero or a positive integer (preferably m is 0 or 1) and n is zero or some positive integer (preferably n is 0 or 1). Examples of cyclic olefin monomers where n is zero are provided in structures IV (a)–(c) below:

(IV)

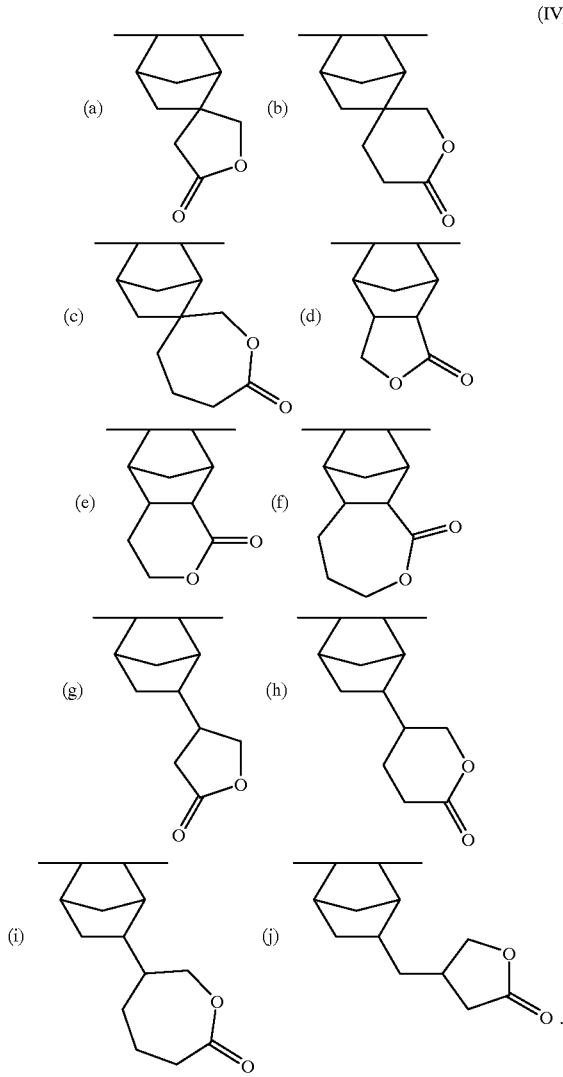

Generally, 5-member or 6-member spirolactone rings are more preferred (e.g., such as structures IV(a) or (b) above).

The cyclic olefin polymer may optionally further contain cyclic olefin units iii) which may be any cyclic olefin monomeric unit having an acidic polar functional group that promotes alkaline solubility. Examples of cyclic olefin monomers include the following monomers illustrated by structure (V) below where $R_2$ represents an acidic polar moiety and n is zero or some positive integer (preferably n is 0 or 1):

(V)

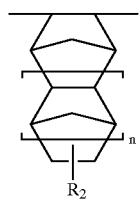

More preferably, the cyclic olefin units iii) are selected from:

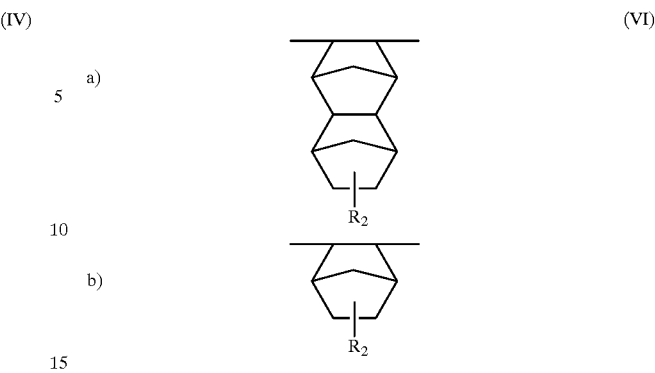

(VI)

where $R_2$ represents an acidic polar moiety which promotes solubility in aqueous alkaline solutions. The acidic polar moieties preferably have a $pK_a$ of about 13 or less. Preferred acidic polar moieties contain polar groups selected from the group consisting of carboxyl, sulfonamidyl, fluoroalcohol, and other acidic polar groups. Preferred acidic polar moieties are carboxyl groups. If desired, combinations of cyclic olefin units iii) having differing acidic polar functional groups may be used.

For photolithographic applications used in the manufacture of integrated circuit structures and other microscopic structures, the cyclic olefin polymers of invention preferably comprise at least about 30 mole % of cyclic olefin units i), more preferably about 50–95 mole %, most preferably about 60–85 mole %. Where the cyclic olefin polymer further contains optional cyclic olefin monomer iii), the amount of cyclic olefin monomer i) is preferably about 40–75 mole %, more preferably about 50–70 mole %. The cyclic olefin polymers of the invention preferably contain at least about 5 mole % of cyclic olefin monomer ii), more preferably about 5–50 mole %, most preferably about 15–40 mole %. Where the cyclic olefin polymer further contains optional cyclic olefin monomer iii), the amount of cyclic olefin monomer ii) is preferably about 10–50 mole %, more preferably about 15–40 mole %.

If the cyclic olefin polymer of the invention contains cyclic olefin monomers iii), the cyclic olefin polymer preferably contains about 5–30 mole % of cyclic olefin units iii), more preferably about 5–15 mole %. The cyclic olefin polymers of the invention preferably consist essentially of cyclic olefin units i) and ii) or of cyclic olefin units i), ii) and iii). The cyclic olefin polymers of the invention preferably contain sufficient monomer i) such that the polymer itself is substantially insoluble in aqueous alkaline developers commonly used in lithographic applications.

In addition to the cyclic olefin polymers, the photoresist compositions of the invention contain a photosensitive acid generator (PAG). The invention is not limited to the use of any specific PAG or combination of PAG's, that is the benefits of the invention may be achieved using various photosensitive acid generators known in the art. Preferred PAG's are those which contain reduced amounts (or preferably zero) aryl moieties. Where aryl-containing PAG is employed, the absorptive characteristics of the PAG at 193 nm may restrict the amount of PAG that can be included in the formulation.

Examples of suitable photosensitive acid generators include (but preferably with alkyl substituted for one or more of any indicated aryl moieties) onium salts such as triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α-α'bis-sulfonyl diazomethanes, naphthoquinone-4-diazides, alkyl disulfones and others.

The photoresist compositions of the invention preferably further contain a bulky, hydrophobic additive ("BH" additives) which is substantially transparent to 193 nm radiation. The BH additives have generally enable and/or enhance the ability to resolve ultrafine lithographic features in response to conventional aqueous alkaline developers. The BH additives are preferably characterized by the presence of at least one alicyclic moiety. Preferably, the BH additive contains at least about 10 carbon atoms, more preferably at least 14 carbon atoms, most preferably about 14 to 60 carbon atoms. The BH additive preferably contains one or more additional moieties such as acid-labile pendant groups which undergo cleaving in the presence of acid to provide a constituent which acts to promote alkaline solubility of the radiation-exposed portions of the photoresist. Preferred BH additives are selected from the group consisting of saturated steroid compounds, non-steroidal alicyclic compounds, and non-steroidal multi-alicyclic compounds having plural acid-labile connecting groups between at least two alicyclic moieties. More preferred BH additives include lithocholates such as t-butyl-3-trifluoroacetyllithocholate, t-butyl adamantane carboxylate, and bis-adamantyl t-butyl carboxylate. Bis-adamantyl t-butyl carboxylate is a most preferred BH additive. If desired, a combination of BH additives can be used.

The photoresist compositions of the invention will typically contain a solvent prior to their application to the desired substrate. The solvent may be any solvent conventionally used with acid-catalyzed photoresists which otherwise does not have any excessively adverse impact on the performance of the photoresist composition. Preferred solvents are propylene glycol monomethyl ether acetate, cyclohexanone, and ethyl cellosolve acetate.

The compositions of the invention may further contain minor amounts of auxiliary components such as dyes/sensitizers, base additives, etc. as are known in the art. Preferred base additives are weak bases which scavenge trace acids while not having an excessive impact on the performance of the photoresist. Preferred base additives are (aliphatic or alicyclic) tertiary alkyl amines or t-alkyl ammonium hydroxides such as t-butyl ammonium hydroxide (TBAH).

The photoresist compositions of the invention preferably contain about 0.5–20 wt. % (more preferably about 3–15 wt. %) photosensitive acid generator based on the total weight of cyclic olefin polymer in the composition. Where a solvent is present, the overall composition preferably contains about 50–90 wt. % solvent. The composition preferably contains about 1 wt. % or less of said base additive based on the total weight of acid sensitive polymer. The photoresist compositions of the invention preferably contain at least about 5 wt. % of the BH additive component based on the total weight of cyclic olefin polymer in the composition, more preferably about 10–25 wt. %, most preferably about 10–20 wt. %.

The lactone cyclic olefin monomers and other monomers used in the present invention may be synthesized by known techniques. For example, the spirolactone-functionalized monomers can be synthesized by Diels-Adler reaction with a-methylene butyrolactone and cyclic olefin (e.g., norbornene). This type of reaction is disclosed by Fotiadu et al., *Tetrahedron Letters*, 1990, 31, 4863–4866. Alternatively, the desired lactone-functionalized monomers can be prepared using processes described by Hasloin et al., *Tetrahedron Letters*, 1976, 4651 and Kayser et al., *Can. J. Chem.* 1978, 56,1524. The invention is not limited to any specific method of synthesizing the cyclic olefin polymers used in the invention. Preferably, the cyclic olefin polymers are formed by addition polymerization. Examples of suitable techniques are disclosed in U.S. Pat. Nos. 5,468,819 and 5,705,503 assigned to B. F. Goodrich Company, the disclosures of which are incorporated herein by reference. The cyclic olefin polymers of the invention preferably have a weight average molecular weight of about 5,000–100,000, more preferably about 10,000–50,000.

The photoresist compositions of the invention can be prepared by combining the cyclic olefin polymer, PAG, optional BH additive and any other desired ingredients using conventional methods. The photoresist composition to be used in photolithographic processes will generally have a significant amount of solvent.

The photoresist compositions of the invention are especially useful for photolithographic processes used in the manufacture of integrated circuits on semiconductor substrates. The compositions are especially useful for photolithographic processes using 193 nm UV radiation. Where use of other radiation (e.g. mid-UV, 248 nm deep UV, x-ray, or e-beam) is desired, the compositions of the invention can be adjusted (if necessary) by the addition of an appropriate dye or sensitizer to the composition. The general use of the photoresist compositions of the invention in photolithography for semiconductors is described below.

Semiconductor photolithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer before application of the photoresist layer. The ARC layer may be any conventional ARC which is compatible with acid catalyzed photoresists.

Typically, the solvent-containing photoresist composition is applied to the desired semiconductor substrate using spin coating or other technique. The substrate with the photoresist coating is then preferably heated (pre-exposure baked) to remove the solvent and improve the coherence of the photoresist layer. The thickness of the applied layer is preferably as thin as possible with the provisos that the thickness is preferably substantially uniform and that the photoresist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the photoresist. Preferably, the pre-exposure bake is performed at temperatures which are at least 20° C. below $T_g$.

After solvent removal, the photoresist layer is then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the photoresist layer. For 193 nm UV radiation, the total exposure energy is preferably about 100 millijoules/cm$^2$ or less, more preferably about 50 millijoules/cm$^2$ or less (e.g. 15–30 .millijoules/cm$^2$).

After the desired patternwise exposure, the photoresist layer is typically baked to further complete the acid-catalyzed reaction and to enhance the contrast of the exposed pattern. The post-exposure bake is preferably conducted at about 100–175° C., more preferably about 125–160° C. The post-exposure bake is preferably conducted for about 30 seconds to 5 minutes.

After post-exposure bake, the photoresist structure with the desired pattern is obtained (developed) by contacting the photoresist layer with an alkaline solution which selectively dissolves the areas of the photoresist which were exposed to radiation. Preferred alkaline solutions (developers) are aqueous solutions of tetramethyl ammonium hydroxide. Preferably, the photoresist compositions of the invention can be developed with conventional 0.26N aqueous alkaline solutions. The photoresist compositions of the invention can also be developed using 0.14N or 0.21N or other aqueous alkaline solutions. The resulting photoresist structure on the substrate is then typically dried to remove any remaining developer solvent. The photoresist compositions of the invention are generally characterized in that the product photoresist structures have high etch resistance. In some instances, it may be possible to further enhance the etch resistance of the photoresist structure by using a post-silylation technique using methods known in the art. The compositions of the invention enable the reproduction of lithographic features.

The pattern from the photoresist structure may then be transferred to the material (e.g., ceramic, metal or semiconductor) of the underlying substrate. Typically, the transfer is achieved by reactive ion etching or some other etching technique. In the context of reactive ion etching, the etch resistance of the photoresist layer is especially important. Thus, the compositions of the invention and resulting photoresist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of photoresist over the material layer or section, patternwise exposing the photoresist to radiation, developing the pattern by contacting the exposed photoresist with a solvent, etching the layer(s) underlying the photoresist layer at spaces in the pattern whereby a patterned material layer or substrate section is formed, and removing any remaining photoresist from the substrate. In some instances, a hard mask may be used below the photoresist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1

A terpolymer containing approximately 20 mole % norbornene spirolactone (as a mixture of isomers), 70 mole % norbornene carboxylic acid t-butyl ester, and 10 mole % norbornene carboxylic acid was prepared by addition polymerization.

EXAMPLE 2

A solution (10% polymer by weight) of the polymer described in Example 1 was prepared in a mixture (80:20 by weight) of propylene glycol methyl ether acetate and γ-butyrolactone. To this solution was added 4% (based on the weight of polymer) bis-(t-butylphenyl)iodonium perfluorooctanesulfonate, and 1.2% (based on weight of polymer) of a 1 M solution of tetra(n-butyl)ammmonium hydroxide in methanol.

Following filtration through a 0.2 μm Teflon membrane, the solution was spin-cast onto a silicon wafer prepared with a commercially available anti-reflective coating, and baked at 130° C. for 60 s. The film thickness was approximately 4000 Å. The film was exposed to patterned 193 nm radiation using an ISI ArF Microstepper, then baked at 150° C. for 90 s. The film was developed using a commercially available 0.262 N TMAH developer for 60 s, then rinsed and dried. Inspection with optical and scanning electron microscopy revealed fine features to dimensions approaching 0.25 μm at doses ranging from 40–50 mJ/cm$^2$.

EXAMPLE 3

A solution (10% polymer by weight) of the polymer described in Example 1 was prepared in propylene glycol methyl ether acetate. To this solution was added 15% (based on the weight of polymer) t-butyl lithocholate, 4% (based on the weight of polymer) bis-(t-butylphenyl)iodonium perfluorooctanesulfonate, and 1.2% (based on weight of polymer) of a 1 M solution of tetra(n-butyl)ammmonium hydroxide in methanol.

Following filtration through a 0.2 μm Teflon membrane, the solution was spin-cast onto a silicon wafer prepared with a commercially available anti-reflective coating, and baked at 130° C. for 60 s. The film thickness was approximately 4000 Å. The film was exposed to patterned 193 nm radiation using an ISI ArF Microstepper, then baked at 150° C. for 90 s. The film was developed using a commercially available 0.262 N TMAH developer for 60 s, then rinsed and dried. Inspection with optical and scanning electron microscopy revealed fine features to dimensions approaching 0.18 μm at doses ranging from 40–50 mJ/cm$^2$.

EXAMPLE 4

A solution (10% polymer by weight) of the polymer described in Example 1 was prepared in propylene glycol methyl ether acetate. To this solution was added 15% (based on the weight of polymer) 2,5-bis(adamantanoyloxy)-2,5-dimethylbutane, 4% (based on the weight of polymer) bis-(t-butylphenyl)iodonium perfluorooctanesulfonate, and 1.2% (based on weight of polymer) of a 1 M solution of tetra(n-butyl)ammmonium hydroxide in methanol.

Following filtration through a 0.2 μm Teflon membrane, the solution was spin-cast onto a silicon wafer prepared with a commercially available anti-reflective coating, and baked at 130° C. for 60 s. The film thickness was approximately 4000 A. The film was exposed to patterned 193 nm radiation using an ISI ArF Microstepper, then baked at 150° C. for 90 s. The film was developed using a commercially available 0.262 N TMAH developer for 60 s, then rinsed and dried. Inspection with optical and scanning electron microscopy revealed fine features to dimensions approaching 0.15 μm at doses ranging from 40–50 mJ/cm$^2$.

What is claimed is:

1. A photoresist composition comprising (a) a cyclic olefin polymer, and (b) a photosensitive acid generator, said cyclic olefin polymer comprising:
   i) cyclic olefin units each having an acid-labile moiety that inhibits solubility in aqueous alkaline solutions, and
   ii) cyclic olefin monomer units each having a lactone moiety, wherein no oxygen atoms are present in any moiety intervening between said lactone moiety and a ring of the cyclic olefin.

2. The photoresist composition of claim 1 wherein said lactone moiety of said cyclic olefin monomer units ii) is selected from the group consisting of (a) lactone fused to a cyclic olefin ring of said monomeric unit ii), (b) a lactone spiro-bonded to a cyclic olefin ring of said monomeric unit ii), (c) a lactone bonded directly to a cyclic olefin ring of said monomeric unit ii) without any atoms being shared between the lactone and said ring of the cyclic olefin, or (d) a lactone bonded to a cyclic olefin ring of said monomeric unit ii) through a hydrocarbon moiety.

3. The photoresist composition of claim 1 wherein said lactone moiety of said cyclic olefin monomer units ii) is a spirolactone moiety selected from the group consisting of 5-member ring spirolactones, 6-member ring spirolactones and 7-member ring spirolactones.

4. The photoresist composition of claim 3 wherein said lactone moiety consists essentially of 5-member ring spirolactones.

5. The photoresist composition of claim 1 further comprising (c) a bulky hydrophobic additive which is substantially transparent to 193 nm radiation.

6. The composition of claim 5 wherein said bulky hydrophobic additive comprises a compound containing at least 10 carbon atoms and having a alicyclic moiety.

7. The composition of claim 6 wherein said bulky hydrophobic additive comprises a compound selected from the group consisting of saturated steroid compounds, non-steroidal alicyclic compounds, and non-steroidal multi-alicyclic compounds having plural acid-labile connecting groups between at least two alicyclic moieties.

8. The composition of claim 5 wherein said composition comprises about 5–25 wt. % of said bulky hydrophobic additive component based on the weight of said cyclic olefin polymer.

9. The composition of claim 1 wherein said cyclic olefin polymer contains at least about 20 mole % of cyclic olefin units i).

10. The composition of claim 1 wherein said cyclic olefin polymer contains at least about 5 mole % of cyclic olefin units ii).

11. The composition of claim 1 wherein said cyclic olefin polymer further comprises iii) cyclic olefin units selected from the group consisting of norbornene and cyclic olefin units having pendant acid groups selected from the group consisting of carboxyl, sulfonamidyl, and fluoroalcohol.

12. The composition of claim 11 wherein said acidic group is a carboxyl group.

13. The composition of claim 1 wherein said cyclic olefin units i) contain an acid-labile protecting group containing a moiety selected from the group consisting of tertiary alkyl carboxyl esters, tertiary cycloalkyl carboxyl, ester ketals, and ester acetals.

14. The composition of claim 1 wherein said cyclic olefin polymer contains about 5–50 mole % of cyclic olefin units ii).

15. The composition of claim 1 wherein said photoresist composition contains at least about 0.5 wt. % of said photosensitive acid generator based on the weight of said cyclic olefin polymer.

16. A patterned photoresist structure on a substrate, said photoresist comprising (a) a cyclic olefin polymer, and (b) a photosensitive acid generator, said cyclic olefin polymer comprising:
   i) cyclic olefin monomer units each having an acid-labile moiety that inhibits solubility in aqueous alkaline solutions, and ii) cyclic olefin monomer units each having a lactone moiety, wherein no oxygen atoms are present in any moiety intervening between said lactone moiety and a ring of the monomer's cyclic olefin.

17. The patterned photoresist structure of claim 16 wherein said photoresist further comprises (c) a bulky hydrophobic additive which is substantially transparent to 193 nm radiation.

18. The patterned photoresist structure of claim 16 wherein said cyclic olefin polymer further comprises iii) cyclic olefin units selected from the group consisting of norbornene and cyclic olefin units having pendant acid groups selected from the group consisting of carboxyl, sulfonamidyl, and fluoroalcohol.

19. A method of forming a patterned photoresist structure on a substrate, said method comprising:
   (A) applying a photoresist composition to said substrate to form a photoresist layer on said substrate, said photoresist composition comprising (a) a cyclic olefin polymer, and (b) a photosensitive acid generator, said cyclic olefin polymer comprising:
      i) cyclic olefin monomer units each having an acid-labile moiety that inhibits solubility in aqueous alkaline solutions, and
      ii) cyclic olefin monomer units each having a lactone moiety, wherein no oxygen atoms are present in any moiety intervening between said lactone moiety and a ring of the monomer's cyclic olefin;
   (B) patternwise exposing said substrate to radiation whereby acid is generated by said photosensitive acid generator in exposed regions of said photoresist layer by said radiation, and
   (C) contacting said substrate with an aqueous alkaline developer solution, whereby said exposed regions of said photoresist layer are selectively dissolved by said developer solution to reveal said patterned photoresist structure on said substrate.

20. The method of claim 19 wherein said photoresist further comprises (c) a bulky hydrophobic additive which is substantially transparent to 193 nm radiation.

21. The method of claim 19 wherein said cyclic olefin polymer further comprises iii) cyclic olefin units selected from the group consisting of norbornene and cyclic olefin units having pendant acid groups selected from the group consisting of carboxyl, sulfonamidyl, and fluoroalcohol.

22. The method of claim 19 wherein said radiation used is step (B) is 193 nm ultraviolet radiation.

23. The method of claim 19 wherein said substrate is baked between steps (B) and (C).

24. A method of forming a patterned material structure on a substrate, said material being selected from the group consisting of semiconductors, ceramics and metals, said method comprising:

(A) providing a substrate with a layer of said material, (B) applying a photoresist composition to said substrate to form a photoresist layer on said substrate, said photoresist composition comprising (a) a cyclic olefin polymer, and (b) a photosensitive acid generator, said cyclic olefin polymer comprising:
  i) cyclic olefin monomer units each having an acid-labile moiety that inhibits solubility in aqueous alkaline solutions, and
  ii) cyclic olefin monomer units each having a lactone moiety, wherein no oxygen atoms are present in any moiety intervening between said lactone moiety and a ring of the monomer's cyclic olefin;

(C) patternwise exposing said substrate to radiation whereby acid is generated by said photosensitive acid generator in exposed regions of said photoresist layer by said radiation, (D) contacting said substrate with an aqueous alkaline developer solution, whereby said exposed regions of said photoresist layer are selectively dissolved by said developer solution to reveal a patterned photoresist structure, and (E) transferring photoresist structure pattern to said material layer, by etching into said material layer through spaces in said photoresist structure pattern.

25. The method of claim 24 wherein said photoresist further comprises (c) a bulky hydrophobic additive which is substantially transparent to 193 nm radiation.

26. The method of claim 24 wherein said cyclic olefin polymer further comprises iii) cyclic olefin units selected from the group consisting of norbornene and cyclic olefin units having pendant acid groups selected from the group consisting of carboxyl, sulfonamidyl, and fluoroalcohol.

27. The method of claim 24 wherein said material is metal.

28. The method of claim 24 wherein said etching comprises reactive ion etching.

29. The method of claim 24 wherein at least one intermediate layer is provided between said material layer and said photoresist layer, and step (E) comprises etching through said intermediate layer.

30. The method of claim 24 wherein said radiation has a wavelength of about 193 nm.

31. The method of claim 24 wherein said substrate is baked between steps (C) and (D).

* * * * *